(12) United States Patent
Koran et al.

(10) Patent No.: US 8,124,868 B2
(45) Date of Patent: Feb. 28, 2012

(54) THIN FILM PHOTOVOLTAIC MODULE WITH CONTOURED DEAIRING SUBSTRATE

(75) Inventors: Francois Andre Koran, Longmeadow, MA (US); Stephen Joseph Norton, Holyoke, MA (US); Khanh Duc Tran, South Hadley, MA (US)

(73) Assignee: Solutia Inc., St. Louis, MO (US)

( * ) Notice: Subject to any disclaimer, the term of this patent is extended or adjusted under 35 U.S.C. 154(b) by 171 days.

(21) Appl. No.: 12/336,512

(22) Filed: Dec. 16, 2008

(65) Prior Publication Data

US 2010/0147373 A1    Jun. 17, 2010

(51) Int. Cl.
*H01L 31/048* (2006.01)
(52) U.S. Cl. .......... 136/251; 136/256; 136/259; 438/64; 438/98
(58) Field of Classification Search .......... 136/252–265; 438/57
See application file for complete search history.

(56) References Cited

U.S. PATENT DOCUMENTS 4,294,602 A * 10/1981 Horne .............................. 65/40

(Continued)

FOREIGN PATENT DOCUMENTS

EP    0257900 A2    3/1988

(Continued)

OTHER PUBLICATIONS

Van Kerschaver, Emmanuel and Beaucarne, Guy, "Back-contact Solar Cells: A Review," Progress in Photovoltaics: Research and Applications, Prog. Photovolt: Res. Appl. 2006; 14: 107-123, published online in Wiley InterScience, www.interscience.wiley.com, 17 pages.

(Continued)

*Primary Examiner* — Jeffrey T Barton
*Assistant Examiner* — Jayne Mershon
(74) *Attorney, Agent, or Firm* — Lewis, Rice & Fingersh, L.C.

(57) ABSTRACT

The present invention provides a thin film photovoltaic module that has a protective substrate, such as glass, that has been contoured to define a space that allows air to avoid entrapment by a bus bar on the thin film photovoltaic device. The contouring of the protective substrate greatly facilitates the deairing and lamination of the module because it reduces or eliminates the amount of trapped air during lamination.
Photovoltaic modules of the present invention can be processed with a minimum of waste caused by deairing and related lamination problems.

9 Claims, 1 Drawing Sheet

U.S. PATENT DOCUMENTS

| | | | |
|---|---|---|---|
| 4,385,226 A | 5/1983 | Sauer | |
| 5,824,994 A | 10/1998 | Noda | |
| 6,288,325 B1 | 9/2001 | Jansen | |
| 7,074,641 B2 | 7/2006 | Kondo et al. | |
| 7,156,666 B2 | 1/2007 | Mann | |
| 7,238,878 B2 | 7/2007 | Gonsiorawski | |
| 7,419,415 B2 | 9/2008 | Jousse | |
| 2002/0053360 A1* | 5/2002 | Kinoshita et al. | 136/251 |
| 2005/0053747 A1* | 3/2005 | Yang et al. | 428/40.1 |
| 2005/0211291 A1* | 9/2005 | Bianchi | 136/255 |
| 2007/0199591 A1 | 8/2007 | Harder | |
| 2008/0000517 A1 | 1/2008 | Gonsiorawski | |
| 2008/0017241 A1 | 1/2008 | Anderson | |
| 2008/0047603 A1* | 2/2008 | Krasnov | 136/256 |
| 2008/0083452 A1* | 4/2008 | Morooka et al. | 136/252 |
| 2008/0185033 A1 | 8/2008 | Kalejs | |
| 2008/0276983 A1* | 11/2008 | Drake et al. | 136/251 |

FOREIGN PATENT DOCUMENTS

| | | |
|---|---|---|
| EP | 1688284 A2 | 8/2006 |
| EP | 1691442 A1 | 8/2006 |
| JP | 2003264308 A | 9/2003 |
| WO | 2010030445 A2 | 3/2010 |

OTHER PUBLICATIONS

International Search Report, International Patent Application No. PCT/US2010/027979, mailed May 26, 2011, 12 pages.

* cited by examiner

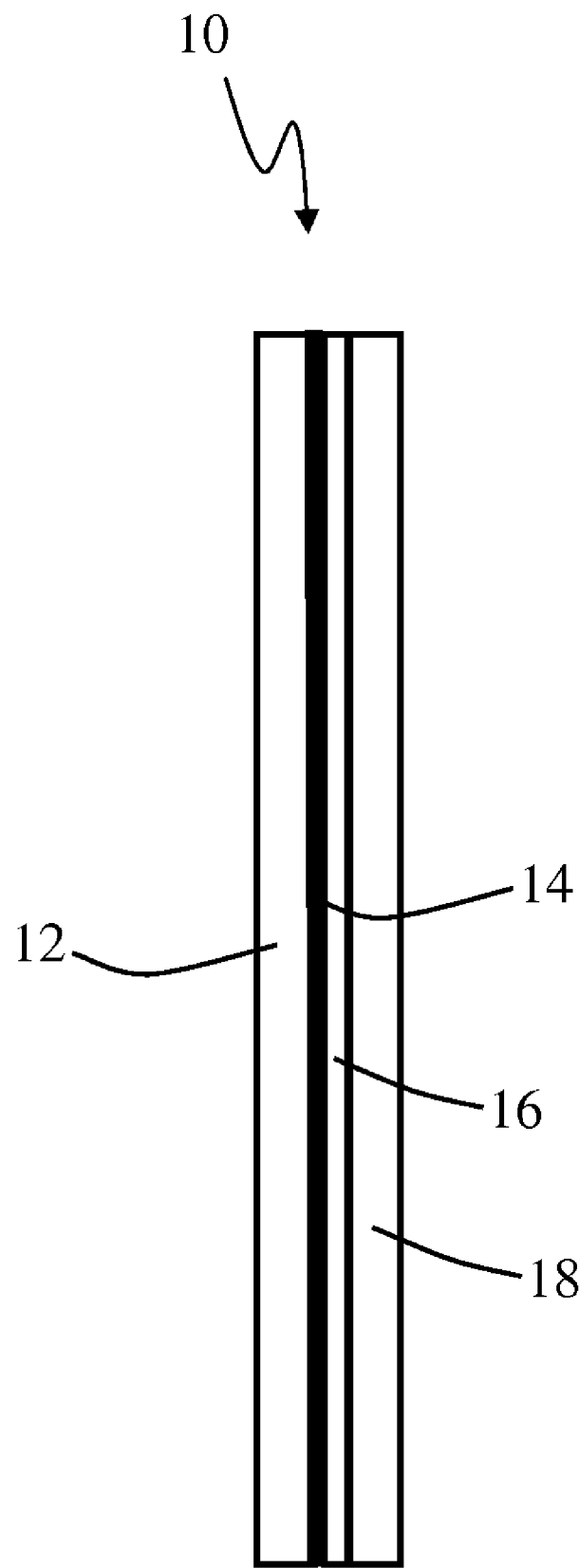

THIN FILM PHOTOVOLTAIC MODULE WITH CONTOURED DEAIRING SUBSTRATE

FIELD OF THE INVENTION

The present invention is in the field of thin film photovoltaic modules, and, specifically, the present invention is in the field of thin film photovoltaic modules incorporating a polymer layer and a photovoltaic device on a suitable thin film photovoltaic substrate.

BACKGROUND

There are two common types of photovoltaic (solar) modules in use today. The first type of photovoltaic module utilizes a semiconductor wafer as a substrate and the second type of photovoltaic module utilizes a thin film of semiconductor that is deposited on a suitable substrate.

Semiconductor wafer type photovoltaic modules typically comprise the crystalline silicon wafers that are commonly used in various solid state electronic devices, such as computer memory chips and computer processors. This conventional design, while useful, is relatively expensive to fabricate and difficult to employ in non-standard applications.

Thin film photovoltaics, on the other hand, can incorporate one or more conventional semiconductors, such as amorphous silicon, on a suitable substrate. Unlike wafer applications, in which a wafer is cut from an ingot in a complex and delicate fabrication technique, thin film photovoltaics are formed using comparatively simple deposition techniques such as sputter coating, physical vapor deposition (PVD), or chemical vapor deposition (CVD).

While thin film photovoltaics are becoming more viable as a practical photovoltaic option to wafer photovoltaics, improvements in the efficiency, durability, and manufacturing expense are needed in the art.

One particularly persistent problem that has been encountered in the manufacture of thin film photovoltaic modules is the difficulty in obtaining an acceptable lamination of the polymeric layer, which is typically provided in sheet form, when a bus bar is present. A failure to properly de-air the bus bar region of the module during fabrication frequently results in an unusable product.

Accordingly, what are needed in the art are improved methods and constructions for producing easily manufactured and stable thin film photovoltaic modules.

SUMMARY OF THE INVENTION

The present invention provides a thin film photovoltaic module that has a protective substrate, such as glass, that has been contoured to define a space that allows air to avoid entrapment by a bus bar on the thin film photovoltaic device. The contouring of the protective substrate greatly facilitates the deairing and lamination of the module because it reduces or eliminates the amount of trapped air during lamination.

Photovoltaic modules of the present invention can be processed with a minimum of waste caused by deairing and related lamination problems.

BRIEF DESCRIPTION OF THE DRAWINGS

FIG. 1 represents a schematic cross sectional view of a thin film photovoltaic module.

DETAILED DESCRIPTION

Thin film photovoltaic devices of the present invention utilize protective substrates that have a surface that has been modified from a planar state to one having contours formed thereon that serve to direct air away from entrapment points near projecting bus bars of an underlying photovoltaic device.

A schematic representation of the general configuration of a thin film photovoltaic module is shown in FIG. 1 generally at 10. As shown in FIG. 1, a thin film photovoltaic device 14 is formed on a base substrate 12, which can be, for example, glass or plastic. A protective substrate 18 is bound to the photovoltaic device 14 with a polymer layer 16. As described in more detail below, the polymer layer 16 can comprise any suitable polymer.

Previous attempts to provide a polymer layer that acceptably seals the photovoltaic module have included using polymeric materials that have relatively high flow, using relatively thick sheets of polymer, using higher lamination pressures and temperatures, and increasing total lamination time. Each of those solutions, however, can present drawbacks. Contoured substrates of the present invention overcome lamination deairing issues.

As used herein, a "contoured" substrate means one in which the surface of the substrate defines patterned depressions below the regular surface of the substrate. For a planar substrate such as a flat glass panel, for example, contouring can include the formation of grooves, channels, cavities, or other intended depression.

As used herein, a "directional depression" is any depression that functions, during lamination, to guide air around bus bars, thereby reducing or preventing air bubble formation in the laminate. As used herein, a directional depression is able to guide air around bus bars either by directly traversing under or over the bus bars, or by guiding air out of the path of the bus bars to the space between the bus bars.

Contouring of the present invention is not limited to any particular cross-sectional shape, and may take any suitable form that facilitates complete lamination of the components of the module. Further, contours can be oriented in any direction to suit the particular photovoltaic device being used in order to provide directional depressions, and can, for example, be formed in parallel, diagonal, or orthogonal arrangements, and can be of the same or differing depths and shapes over the substrate.

In various embodiments, contouring can take the form of one or more grooves that are formed across all or a portion of the substrate. In this manner, lamination of thin film photovoltaic modules of the present invention allows for much improved de-airing and sealing around the bus bars, without requiring relatively thick polymer layers, relatively long lamination times, or relatively high processing temperatures and pressures.

Contoured protective substrates of the present invention can be formed in any suitable manner. In various embodiments, for example, contours are formed by milling, for example with a diamond coated drill, or by grinding with a stone or diamond coated grinding wheel, among other well-known techniques such as abrasive blasting and chemical, water, or laser etching, among others.

Contours can be formed in any suitable pattern, from simple patterns in which straight depressions are formed or more complex patterns comprising any desired combination of contours.

Contours can be formed in any desired depth and width, according to the application. In various embodiments, contours have a depth of 0.0254 to 0.508 millimeters (0.001 to 0.020 inches), from 0.127 to 0.305 millimeters (0.005 to 0.012 inches), from 0.0254 to 0.229 millimeters (0.001 to 0.009 inches), or from 0.0254 to 0.127 millimeters (0.001 to 0.005 inches). Contours having any of the depths just mentioned can have any of the following widths, in any combination: 0.1 to 15 millimeters, 0.2 to 10 millimeters, or 3 to 6 millimeters.

In various embodiments of the present invention, the percentage of the surface area of the side of a substrate in contact with a polymer layer that has been contoured can be 0.01 to 70%, 0.025 to 50%, or 0.1 to 30%. In various embodiments, the percentage of the surface area of the side of a substrate in contact with a polymer layer that has been contoured can be 0.5 to 70%, 1 to 70%, 3 to 70%, 5 to 70%, 10 to 70%, or 20 to 70%.

In various embodiments, the amount of contouring is measured as a percentage of total bus bar length that overlies a contour, regardless of the length the contours extend beyond the bus bars. In various embodiments, the portion of the total bus bar length that overlies a contour is 0.1 to 70%, 0.2 to 50%, or 0.4 to 30% of total bus bar length. In various embodiments, the portion of the total bus bar length that overlies a contour is 0.5 to 70%, 1 to 70%, 3 to 70%, 5 to 70%, 10 to 70%, or 20 to 70% of total bus bar length.

For any given substrate, any combination of contours can be provided, including contours having different profiles and depths. Contours can be formed on one or both substrates.

In various embodiments of the present invention, the thickness of the polymer layer that is used can be less than 2.29 millimeters (0.090 inches), 1.143 millimeters (0.045 inches), 0.762 millimeters (0.030 inches), or 0.381 millimeters (0.015 inches). In further embodiments, and particularly nip-roll non-autoclave processes, a polymer layer having a thickness of less than 0.508 millimeters (0.020 inches) or a thickness of between 0.254 and 0.508 millimeters (0.010 inches and 0.020 inches) can be employed, which is not generally the case for conventional applications in which the use of such a thin layer would fail to result in successful lamination.

In further embodiments of the present invention, contoured substrates of the present invention are used in a lamination process that uses vacuum deairing, for example vacuum ring and vacuum bag deairing, both using an autoclave and without the use of an autoclave. In these embodiments, unlike in nip roll embodiments, air is removed from the laminate radially from a center point, and thus must be drawn around different portions of the bus bar.

Base Substrate

Base substrates of the present invention, which are shown as element 12 in FIG. 1, can be any suitable substrate onto which the photovoltaic devices of the present invention can be formed. Examples include, but are not limited to, glass, and rigid plastic glazing materials which yield "rigid" thin film modules, and thin plastic films such as poly(ethylene terephthalate), polyimides, fluoropolymers, and the like, which yield "flexible" thin film modules. It is generally preferred that the base substrate allow transmission of most of the incident radiation in the 350 to 1,200 nanometer range, but those of skill in the art will recognize that variations are possible, including variations in which light enters the photovoltaic device through the protective substrate.

Thin Film Photovoltaic Device

Thin film photovoltaic devices of the present invention, which are shown as element 14 in FIG. 1, are formed directly on the base substrate. Typical device fabrication involves the deposition of a first conductive layer, etching of the first conductive layer, deposition and etching of semiconductive layers, deposition of a second conductive layer, etching of the second conductive layer, and application of bus conductors and protective layers, depending on the application. An electrically insulative layer can optionally be formed on the base substrate between the first conductive layer and the base substrate. This optional layer can be, for example, a silicon layer.

It will be recognized by those of skill in the art that the foregoing description of device fabrication is but one known method and is but one embodiment of the present invention. Many other types of thin film photovoltaic devices are within the scope of the present invention. Examples of formation methods and devices include those described in U.S. Patent documents 2003/0180983, U.S. Pat. Nos. 7,074,641, 6,455, 347, 6,500,690, 2006/0005874, 2007/0235073, U.S. Pat. No. 7,271,333, and 2002/0034645, the relevant fabrication and device portions of which are incorporated herein in their entirety.

The various components of the thin film photovoltaic device can be formed through any suitable method. In various embodiments chemical vapor deposition (CVD), physical vapor deposition (PVD), and/or sputtering can be used.

The two conductive layers described above serve as electrodes to carry the current generated by the interposed semiconductor material. One of the electrodes typically is transparent to permit solar radiation to reach the semiconductor material. Of course, both conductors can be transparent, or one of the conductors can be reflective, resulting in the reflection of light that has passed through the semiconductor material back into the semiconductor material. Conductive layers can comprise any suitable conductive oxide material, such as tin oxide or zinc oxide, or, if transparency is not critical, such as for "back" electrodes, metal or metal alloy layers, such as those comprising aluminum or silver, can be used. In other embodiments, a metal oxide layer can be combined with the metal layer to form an electrode, and the metal oxide layer can be doped with boron or aluminum and deposited using low-pressure chemical vapor deposition. The conductive layers can be, for example, from 0.1 to 10 micrometers in thickness.

The photovoltaic region of the thin film photovoltaic device can comprise, for example, hydrogenated amorphous silicon in a conventional PIN or PN structure. The silicon can be typically up to about 500 nanometers in thickness, typically comprising a p-layer having a thickness of 3 to 25 nanometers, an i-layer of 20 to 450 nanometers, and an n-layer of 20 to 40 nanometers. Deposition can be by glow discharge in silane or a mixture of silane and hydrogen, as described, for example, in U.S. Pat. No. 4,064,521.

Alternatively, the semiconductor material may be micromorphous silicon, cadmium telluride (CdTe or CdS/CdTe), copper indium diselenide, ($CuInSe_2$, or "CIS", or CdS/$CuInSe_2$), copper indium gallium selenide ($CuInGaSe_2$, or "CIGS"), or other photovoltaically active materials. Photovoltaic devices of this invention can have additional semiconductor layers, or combinations of the foregoing semiconductor types, and can be a tandem, triple-junction, or heterojunction structure.

Etching of the layers to form the individual components of the device can be performed using any conventional semiconductor fabrication technique, including, but not limited to, silkscreening with resist masks, etching with positive or negative photoresists, mechanical scribing, electrical discharge scribing, chemical etching, or laser etching. Etching of the various layers will result, typically, in the formation of individual photocells within the device. Those photocells can be electrically connected to each other using bus bars that are inserted or formed at any suitable stage of the fabrication process.

A protective layer can optionally be formed over the photocells prior to assembly with the polymer layer and the protective substrate. The protective layer can be, for example, sputtered aluminum.

The electrically interconnected photocells formed from the optional insulative layer, the conductive layers, the semiconductor layers, and the optional protective layer form the photovoltaic device of the present invention.

Polymer Layer

Any suitable thermoplastic polymer can be used for the polymer layer of the present invention, including poly(vinyl butyral), non-plasticized poly(vinyl butyral), polyurethane, poly(ethylene-co-vinyl acetate), thermoplastic polyurethane, polyethylene, polyolefin, poly(vinyl chloride), silicone, poly (ethylene-co-ethyl acrylate), ionomers of partially neutralized ethylene/(meth)acrylic acid copolymer (such as Surlyn® from DuPont), polyethylene copolymers, glycol modified polyethylene (PETG), or any other suitable polymeric material. In various embodiments, the polymer comprises poly (ethylene-co-vinyl acetate) (EVA) or ionomers of partially neutralized ethylene/(meth)acrylic acid copolymer.

In various embodiments poly(vinyl butyral) can have a molecular weight of at least 30,000, 40,000, 50,000, 55,000, 60,000, 65,000, 70,000, 120,000, 250,000, or at least 350,000 grams per mole (g/mole or Daltons). Small quantities of a dialdehyde or trialdehyde can also be added during the acetalization step to increase molecular weight to at least 350 g/mole (see, for example, U.S. Pat. Nos. 4,902,464; 4,874, 814; 4,814,529; and, 4,654,179). As used herein, the term "molecular weight" means the weight average molecular weight.

The poly(vinyl butyral) layers of the present invention can include low molecular weight epoxy additives. Any suitable epoxy agent can be used with the present invention, as are known in the art (see, for example, U.S. Pat. Nos. 5,529,848 and 5,529,849).

In various embodiments, epoxy compositions found usable as hereinafter described are selected from (a) epoxy resins comprising mainly the monomeric diglycidyl ether of bisphenol-A; (b) epoxy resins comprising mainly the monomeric diglycidyl ether of bisphenol-F; (c) epoxy resins comprising mainly the hydrogenated diglycidyl ether of bisphenol-A; (d) polyepoxidized phenol novolacs; (e) diepoxides of polyglycols, alternatively known as an epoxy terminated polyether; and (f) a mixture of any of the foregoing epoxy resins of (a) through (e) (see the Encyclopedia of Polymer Science and Technology, Volume 6, 1967, Interscience Publishers, N.Y., pages 209-271).

Epoxy agents can be incorporated into poly(vinyl butyral) layers in any suitable amount. In various embodiments, epoxy agents are incorporated at 0.5 to 15 phr, 1 to 10 phr, or 2 to 3 phr (parts per hundred parts resin). These amounts can be applied to any of the individual epoxy agents listed above, and in particular those shown in Formula I, and to the total amount of mixtures of the epoxy agents described herein.

Adhesion control agents (ACAs) can also be used in polymer layers of the present invention and include those disclosed in U.S. Pat. No. 5,728,472. Additionally, residual sodium acetate and/or potassium acetate can be adjusted by varying the amount of the associated hydroxide used in acid neutralization. In various embodiments, polymer layers of the present invention comprise, in addition to sodium acetate and/or potassium acetate, magnesium bis(2-ethyl butyrate) (chemical abstracts number 79992-76-0). The magnesium salt can be included in an amount effective to control adhesion of the polymer layer.

Poly(vinyl butyral) can be produced by known acetalization processes that involve reacting poly(vinyl alcohol) with butyraldehyde in the presence of an acid catalyst, followed by neutralization of the catalyst, separation, stabilization, and drying of the resin.

As used herein, "resin" refers to the poly(vinyl butyral) component that is removed from the mixture that results from the acid catalysis and subsequent neutralization of the polymeric precursors. Resin will generally have other components in addition to the poly(vinyl butyral), such as acetates, salts, and alcohols.

Details of suitable processes for making poly(vinyl butyral) resin are known to those skilled in the art (see, for example, U.S. Pat. Nos. 2,282,057 and 2,282,026). In one embodiment, the solvent method described in Vinyl Acetal Polymers, in Encyclopedia of Polymer Science & Technology, $3^{rd}$ edition, Volume 8, pages 381-399, by B. E. Wade (2003) can be used. In another embodiment, the aqueous method described therein can be used. Poly(vinyl butyral) is commercially available in various forms from, for example, Solutia Inc., St. Louis, Mo. as Butvar™ resin.

As used herein, the term "molecular weight" means the weight average molecular weight.

Any suitable plasticizers can be added to the poly(vinyl butyral) resins of the present invention in order to form the poly(vinyl butyral) layers. Plasticizers used in the poly(vinyl butyral) layers of the present invention can include esters of a polybasic acid or a polyhydric alcohol, among others. Suitable plasticizers include, for example, triethylene glycol di-(2-ethylbutyrate), triethylene glycol di-(2-ethylhexanoate), triethylene glycol diheptanoate, tetraethylene glycol diheptanoate, dihexyl adipate, dioctyl adipate, hexyl cyclohexyladipate, mixtures of heptyl and nonyl adipates, diisononyl adipate, heptylnonyl adipate, dibutyl sebacate, polymeric plasticizers such as the oil-modified sebacic alkyds, mixtures of phosphates and adipates such as those disclosed in U.S. Pat. No. 3,841,890 and adipates such as those disclosed in U.S. Pat. No. 4,144,217, and mixtures and combinations of the foregoing. Other plasticizers that can be used are mixed adipates made from $C_4$ to $C_9$ alkyl alcohols and cyclo $C_4$ to $C_{10}$ alcohols, as disclosed in U.S. Pat. No. 5,013,779, and $C_6$ to $C_8$ adipate esters, such as hexyl adipate. In preferred embodiments, the plasticizer is triethylene glycol di-(2-ethylhexanoate).

In some embodiments, the plasticizer has a hydrocarbon segment of fewer than 20, fewer than 15, fewer than 12, or fewer than 10 carbon atoms.

Additives may be incorporated into the poly(vinyl butyral) layer to enhance its performance in a final product. Such additives include, but are not limited to, plasticizers, dyes, pigments, stabilizers (e.g., ultraviolet stabilizers), antioxidants, flame retardants, other IR absorbers, UV absorbers, anti-block agents, combinations of the foregoing additives, and the like, as are known in the art.

One exemplary method of forming a poly(vinyl butyral) layer comprises extruding molten poly(vinyl butyral) comprising resin, plasticizer, and additives, and then forcing the melt through a sheet die (for example, a die having an opening that is substantially greater in one dimension than in a perpendicular dimension). Another exemplary method of forming a poly(vinyl butyral) layer comprises casting a melt from a die onto a roller, solidifying the melt, and subsequently removing the solidified melt as a sheet.

As used herein, "melt" refers to a mixture of resin with a plasticizer and, optionally, other additives. In either embodiment, the surface texture at either or both sides of the layer may be controlled by adjusting the surfaces of the die opening or by providing texture at the roller surface. Other techniques for controlling the layer texture include varying parameters of the materials (for example, the water content of the resin and/or the plasticizer, the melt temperature, molecular weight distribution of the poly(vinyl butyral), or combinations of the foregoing parameters). Furthermore, the layer can be configured to include spaced projections that define a temporary surface irregularity to facilitate the deairing of the layer during lamination processes after which the elevated temperatures and pressures of the laminating process cause the projections to melt into the layer, thereby resulting in a smooth finish.

Protective Substrate

Protective substrates of the present invention, which are shown as element 18 in the FIGURES, can be any suitable substrate that can be used to support the module and that can be processed to define sufficiently sized contours, as described above. Examples include, but are not limited to, glass and rigid plastic. It is generally preferred that the protective substrate allow transmission of most of the incident radiation in the 350 to 1,200 nanometer range, but those of skill in the art will recognize that variations are possible, including variations in which all of the light entering the photovoltaic device enters through the base substrate. In these embodiments, the protective substrate does not need to be transparent, or mostly so, and can be, for example, a reflective film that prevents light from exiting the photovoltaic module through the protective substrate.

Assembly

Final assembly of thin film photovoltaic modules of the present invention involves disposing a polymer layer in contact with a thin film photovoltaic device, with bus bars, that has been formed on a base substrate, disposing a protective substrate in contact with the polymer layer, and laminating the assembly to form the module.

In various embodiments of the present invention, a conventional autoclave lamination process is used. In other embodiments a non-autoclave process, such as a nip roll or vacuum bag or ring process, is used. In one such process, after assembly, the components are placed in a vacuum bag or ring, and de-aired under vacuum, such as from 0.7-0.97 atmospheres, for a suitable time, for example for 0-60 minutes, and then the temperature is raised to finish the module at a temperature of, for example, 70-150° C. Optionally, the module can be autoclaved to finish the module. In various preferred non-autoclave embodiments, polymer moisture content is kept relatively low, for example from 0.1-0.35%.

Photovoltaic modules of the present invention provide the advantage of allowing the use of nonautoclave processes with a very high rate of acceptable product. One particular process—the nip roll nonautoclave process—is described in U.S. patent publication 2003/0148114 A1. Nonautoclave photovoltaic module formation, without the contoured glass of the present invention, has been problematic when 0.762 millimeter (30 mil) polymer sheet layers are used, with a very high defect rate. The present invention, with contoured substrate, allows for superior deairing, resulting in a much lower defect rate. In various embodiments of the present invention, any of the photovoltaic modules of the present invention described herein can be produced successfully at high yields using a nonautoclave process with polymer sheets having thicknesses as low as about 0.254 millimeters (10 mils), for example from 0.203 to 0.381 millimeters (8 to 15 mils) or from 0.203 to 0.305 millimeters (8 to 12 mils). Of course, lamination of thicker layers is readily achieved with these non-autoclave techniques.

In addition to its application to photovoltaic modules, the contoured glass of the present invention can be used with effectiveness in heated, laminated glass applications having bus bars, such as rear automobile defrosters having an integrated grid for defrosting. In applications such as those, a grid of heating elements is typically connected to raised bus bars that present laminating difficulties such as those encountered in photovoltaic module manufacture.

The present invention includes a method of making a photovoltaic module, comprising the steps of providing a base substrate, forming a photovoltaic device thereon, and laminating the photovoltaic device to a protective, contoured substrate of the present invention using a polymer layer of the present invention, where the contoured substrate has contours that provide directional depressions around one or more bus bars.

By virtue of the present invention, it is now possible to provide thin film photovoltaic modules having excellent physical stability and low defect rate processing.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

It will further be understood that any of the ranges, values, or characteristics given for any single component of the present invention can be used interchangeably with any ranges, values, or characteristics given for any of the other components of the invention, where compatible, to form an embodiment having defined values for each of the components, as given herein throughout. For example, the poly (vinyl butyral) epoxide ranges and plasticizer ranges can be combined to form many permutations that are within the scope of the present invention, but that would be exceedingly cumbersome to list.

Any FIGURE reference numbers given within the abstract or any claims are for illustrative purposes only and should not be construed to limit the claimed invention to any one particular embodiment shown in any FIGURE.

FIGURES are not drawn to scale unless otherwise indicated.

Each reference, including journal articles, patents, applications, and books, referred to herein is hereby incorporated by reference in its entirety.

We claim:

1. A thin film photovoltaic module, comprising:
    a base substrate;
    a thin film photovoltaic device disposed in contact with said base substrate, wherein said photovoltaic device comprises a bus bar, wherein said bus bar protrudes from the surface of said device;
    a polymer layer disposed in contact with said photovoltaic device; and,
    a protective substrate disposed in contact with said polymer layer;
    wherein said protective substrate is contoured so as to provide at least one directional depression located opposite said bus bar; wherein said bus bar comprises a transverse projection and said at least one directional depression is orthogonal or diagonal to said transverse projection; and wherein said polymer layer is between said photovoltaic device and said protective substrate.

2. The module of claim 1, wherein both said base substrate and said protective substrate comprise glass.

3. The module of claim 1, wherein said polymer layer comprises poly(vinyl butyral).

4. The module of claim 1, wherein said at least one directional depression is directed to the side of said transverse projection.

5. The module of claim 1, wherein said at least one directional depression has a width of 0.1 to 15 millimeters.

6. The module of claim 1, wherein said at least one directional depression has a width of 3 to 6 millimeters.

7. The module of claim 1, wherein said at least one directional depression has a depth of 0.0254 to 0.508 millimeters.

8. The module of claim 1, wherein said at least one directional depression has a depth of 0.0254 to 0.127 millimeters.

9. A thin film photovoltaic module produced by the process comprising:

providing a base substrate;

forming a thin film photovoltaic device on said base substrate, wherein said photovoltaic device comprises a bus bar, wherein a portion of said bus bar protrudes from the surface of said device;

placing a polymer layer on said photovoltaic device in contact with said bus bar;

placing a protective substrate on said polymer layer so as to place said polymer layer between said photovoltaic device and said protective substrate, said protective substrate being contoured so as to provide a depression located opposite said bus bar; wherein said bus bar comprises a transverse projection and said at least one directional depression is orthogonal or diagonal to said transverse projection; and, laminating said base substrate with said device, said polymer layer, and said protective substrate to form said module.

* * * * *